United States Patent [19]

Bender et al.

[11] Patent Number: 4,918,381

[45] Date of Patent: Apr. 17, 1990

[54] AUTOMATED METHOD FOR DETERMINING TOTAL HARMONIC DISTORTION

[75] Inventors: Martin A. Bender, Seattle; Thomas V. Bruhns, Everett, both of Wash.

[73] Assignee: Hewlett-Packard Company, Palo Alto, Calif.

[21] Appl. No.: 335,312

[22] Filed: Apr. 6, 1989

[51] Int. Cl.[4] ............................................. G01R 23/16
[52] U.S. Cl. ................................ 324/77 B; 324/77 R
[58] Field of Search ................. 324/77 R, 77 B, 78 R, 324/79 R, 79 D, 78 D, 83 R, 83 FE; 381/31; 328/162; 455/67

[56] References Cited

U.S. PATENT DOCUMENTS

| | | | |
|---|---|---|---|
| 3,573,446 | 4/1971 | Bergland | 235/156 |
| 3,581,199 | 5/1971 | Spitz | 324/77 |
| 3,634,760 | 1/1972 | Murtin | 324/77 R |
| 3,881,097 | 4/1975 | Lehmann et al. | 235/156 |
| 3,920,978 | 11/1975 | Schmitt et al. | 235/156 |
| 3,978,403 | 8/1976 | Mansfield | 324/77 B |
| 4,267,600 | 5/1981 | Campbell | 324/77 B |
| 4,340,854 | 7/1982 | Jones et al. | 328/162 |
| 4,607,216 | 8/1986 | Yamaguchi et al. | 324/77 B |
| 4,616,352 | 10/1986 | Sallas | 324/83 FE |
| 4,686,457 | 8/1987 | Banno | 324/77 R |
| 4,741,039 | 4/1988 | Bloy | 381/31 |
| 4,853,963 | 8/1989 | Bloy et al. | 381/31 |

Primary Examiner—Michael J. Tokar

[57] ABSTRACT

The accuracy of an automated THD measurement performed by an FFT signal analyzer is improved by refining the estimate of the signal's fundamental frequency on which the THD analysis is based. This refinement is accomplished by calculating a parameter that represents the relative accuracy of the estimate and then varying the estimate to maximize the parameter. The result is a process which permits refinement of the fundamental frequency to an almost arbitrary accuracy, resulting in a highly improved measurement of THD.

10 Claims, 3 Drawing Sheets

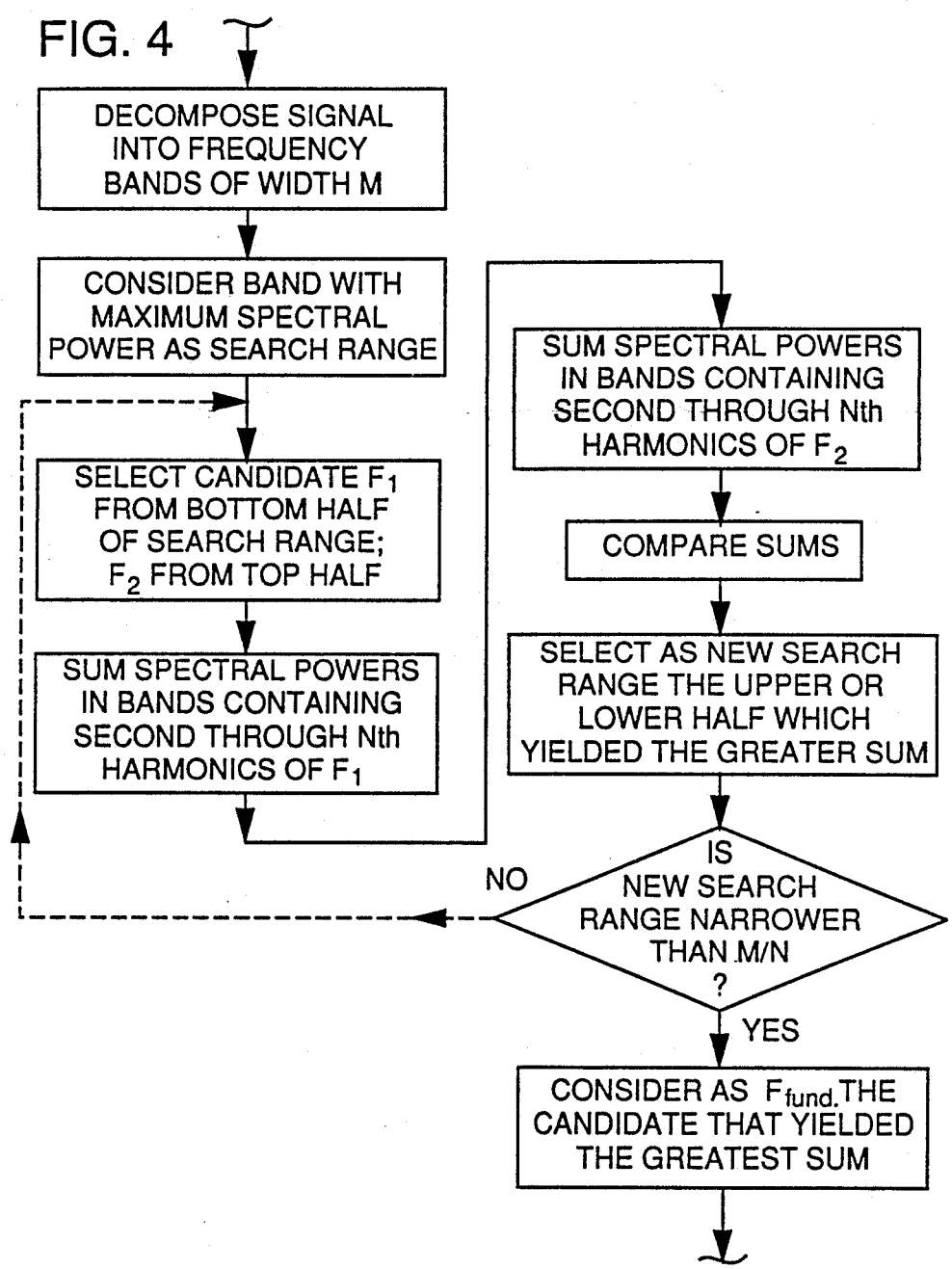

AUTOMATED METHOD FOR DETERMINING TOTAL HARMONIC DISTORTION

FIELD OF THE INVENTION

The present invention relates to methods for measuring total harmonic distortion of a signal using fast Fourier transform signal analyzers, and more particularly relates to a technique for improving the accuracy of such measurements by improving the resolution with which an analyzer can determine the signal's fundamental frequency.

BACKGROUND AND SUMMARY OF THE INVENTION

Fast Fourier transform (FFT) signal analyzers are well known in the art, as shown by U.S. Pat. Nos. 3,573,446, 3,581,199, 3,634,760, 3,881,097, 3,920,978, 4,607,216 and 4,686,457, some of which date back fifteen years and more.

The current state of the art is illustrated by the Hewlett-Packard HP-35660 Dynamic Signal Analyzer. Included in this and other comparable instruments is a Total Harmonic Distortion function that can determine the frequencies at which the harmonics of a fundamental signal should be found and can sum the spectral powers at these harmonics. The ratio of this sum to the signal's power at the fundamental frequency is a commonly used measure of the signal's total harmonic distortion.

Due to the use of the fast Fourier transform in such instruments, the signal spectrums analyzed are broken into discrete ranges of frequencies, termed "bins." The bandwidth of these bins is dependent on the length of the interval during which the instrument samples the signal. If the interval is very short, the component frequencies of the signal cannot be resolved very accurately and the bins are commensurately broad. As the interval is lengthened, resolution of the spectrum improves and bins narrow. For example, with a sampling interval of 3.90625 milliseconds and a sampling rate of 262,144 hertz, a spectrum resolution, or bin width, of 256 hertz is obtained.

To determine the total harmonic distortion (THD) of a signal, the frequency of the fundamental must first be known so that the frequencies of the harmonics can be determined and the signal components at these frequencies can be summed. In automated measurements of THD it is common practice to measure the spectrum and assume that the frequency component of largest amplitude is the fundamental. However, since FFT analyzers can only resolve the frequency of a signal to the width of one frequency bin, some assumption must be made as to the fundamental's precise frequency. In prior art automated analysis techniques, the assumption has typically been that the fundamental frequency is at the center of the bin with the maximum amplitude. This assumption is then used in determining which harmonic bins should be examined and summed to determine harmonic content of the signal.

If the fundamental frequency is not, in fact, at the center of the bin, the process will incorrectly calculate the frequencies at which the harmonics occur and may examine the wrong bins to determine the harmonic amplitudes. The wrong bins will not contain harmonics and will thus provide a misleadingly low indication of THD.

Consider, for example, a system in which the bin width is 256 hertz and the fundamental is at 2700 hertz. 2700 hertz is included in the 12th bin, which extends from 2688 to 2944 hertz with a center frequency of 2816. The deviation of the actual fundamental from the center of the bin is 116 hertz. In evaluating the harmonic distortion contributed by the eighth harmonic, the process would calculate the harmonic to be at (8*2816) or 22,528 hertz, which falls in the 89th bin. However, the actual harmonic is at (8*2700) or 21,600 hertz, which falls in the 85th bin. The amplitude of signals in the 89th bin, which is examined by the process in compiling THD, will normally be substantially less than the amplitude of signals in correct bin 85. The resulting THD measurement will thus be much lower than is actually the case.

If the analyzer is being operated by a skilled technician, this problem can be overcome. The default assumption that the fundamental is in the center of the largest amplitude bin can be overridden. The technician can enter the precise fundamental frequency, if it is known, on a data entry keypad on the instrument. Alternatively, he can adjust a vernier frequency control until harmonic marker signals displayed on the analyzer screen coincide with the harmonic spectral peaks in the signal being analyzed. However, these techniques require intervention of a skilled operator and are unsuitable for fully automated test and measurement applications.

A need remains for a technique that will permit accurate determinations of THD without intervention of a skilled operator.

According to the present invention, the accuracy of an automated THD measurement is improved by refining the estimate of the signal's fundamental frequency on which the THD analysis is based. This refinement is accomplished by calculating a parameter that represents the relative accuracy of the estimate and then varying the estimate to maximize the parameter. The result is a process which permits refinement of the fundamental frequency to an almost arbitrary accuracy, resulting in a highly improved, speed efficient measurement of THD.

The foregoing and additional objects, features and advantages of the present invention will be more readily apparent from the following detailed description thereof, which proceeds with reference to the accompanying drawings.

BRIEF DESCRIPTION OF THE DRAWINGS

FIG. 4 is a flow chart illustrating another particular technique for approximating the frequency of the fundamental in the process of FIG. 2.

DETAILED DESCRIPTION

Figure 1:
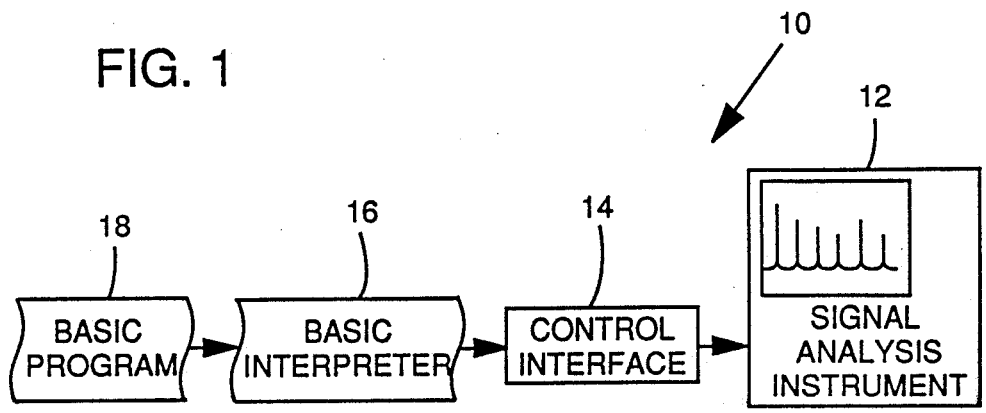
FIG. 1 is a block diagram of an apparatus for practicing the present invention.

Referring to FIG. 1, an apparatus 10 for practicing the present invention may include a signal analysis instrument 12, a control interface 14, a Basic language interpreter 16 and a Basic language program 18. The signal analysis instrument 12 may be any FFT based device. In the preferred embodiment, a Hewlett-Packard HP-35660 Dynamic Signal Analyzer is used. This and comparable instruments have a built in THD function that is advantageously used in the present invention to determine total harmonic distortion.

The control interface 14 permits the instrument 12 to be controlled by external command signals, here provided by the Basic language interpreter 16. In the preferred embodiment, this interface is implemented principally in software executing on a Motorola 68000 series microprocessor in the HP-35660 Dynamic Signal Analyzer. Other control interfaces could be used in other embodiments, such as interfaces commercially available for the IEEE-488 or GPIB instrumentation control buses.

Driving the control interface 14 is a Basic language interpreter 16. A suitable interpreter is available on a diskette from Hewlett-Packard as part number HP-35680. The above-mentioned Dynamic Signal Analyzer contains a floppy drive from which this interpreter diskette can be run. The microprocessor in the instrument executes the interpreter's instructions and controls the interface 14 accordingly.

The Basic language program 18 contains the instructions that actually implement the methodology of the present invention. This methodology is described below.

Figure 2:
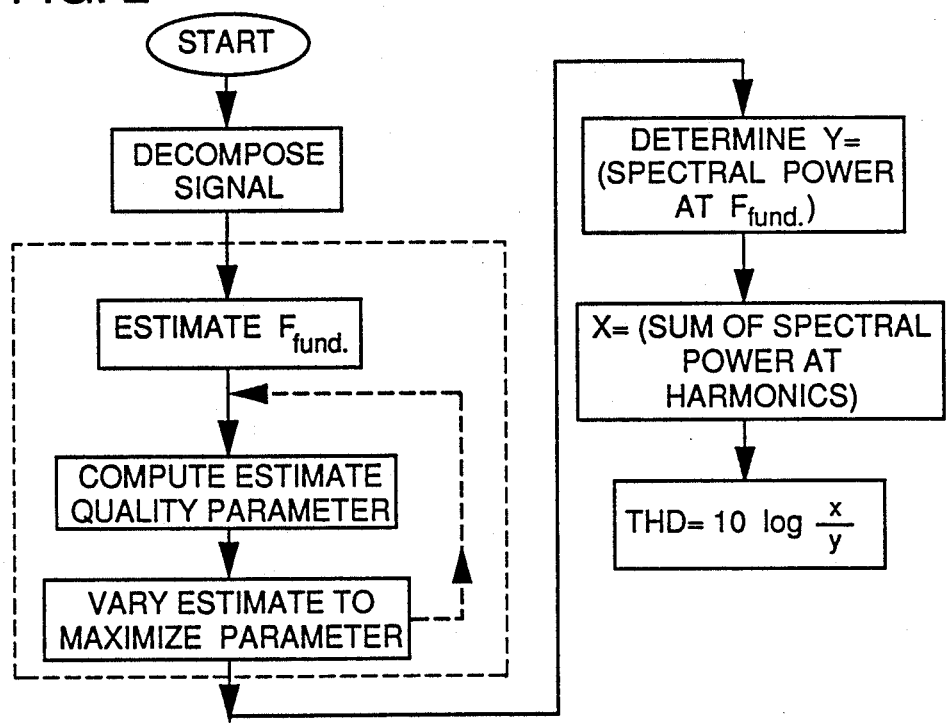
FIG. 2 is a flow chart illustrating the basic method of determining THD used in the present invention.

Referring to FIG. 2, the signal spectrum that is to be analyzed for harmonic distortion is first decomposed by well known Fourier techniques into a plurality of discrete frequency ranges, commonly termed "bins." In the preferred embodiment, the instrument decomposes the signal spectrum into approximately 400 bins, each having a width of 256 hertz. To clarify further discussions, the boundaries and center frequencies of the first dozen bins, in hertz, are set forth below:

| BIN NO. | FREQUENCY RANGE | CENTER FREQUENCY |
|---------|-----------------|------------------|
| 1 | −128–128 | 0 |
| 2 | 128–384 | 256 |
| 3 | 384–640 | 512 |
| 4 | 640–896 | 768 |
| 5 | 896–1152 | 1024 |
| 6 | 1152–1408 | 1280 |
| 7 | 1408–1664 | 1536 |
| 8 | 1664–1920 | 1792 |
| 9 | 1920–2176 | 2048 |
| 10 | 2176–2432 | 2304 |
| 11 | 2432–2688 | 2560 |
| 12 | 2688–2944 | 2816 |

The frequency range spans of other bins can be computed as extending from 256*(Bin No.-1.5) hertz to 256*(Bin No.-0.5) hertz. The center frequency of each bin is at 256*(Bin. No.-1) hertz.

In the decomposition process, the Fourier calculations produce a coefficient for each of these bins that indicates the relative power contained in that portion of the signal spectrum. This step is performed in prior art FFT instruments.

Continuing through FIG. 2, after decomposing the signal, the process begins a subprocess to approximate the fundamental frequency. Unlike the prior art, this subprocess used in the present invention does not simply assume that the fundamental is at the center of the largest amplitude bin. Instead, it makes several estimates of the fundamental frequency and for each estimate calculates a quality parameter related to the quality of the estimate. After two or more estimates have been made, the estimate that yielded the best quality parameter is used as the fundamental frequency in further calculations.

These further calculations are conventional and are shown as the last three steps in FIG. 2. Basically, the process determines the spectral power at the fundamental frequency (typically represented by the Fourier coefficient for the maximum amplitude bin) and then sums the spectral powers of the bins that are determined to contain harmonics of the approximated fundamental frequency. Total Harmonic Distortion is then computed as the ratio of these powers, expressed logarithmically.

Figure 3:
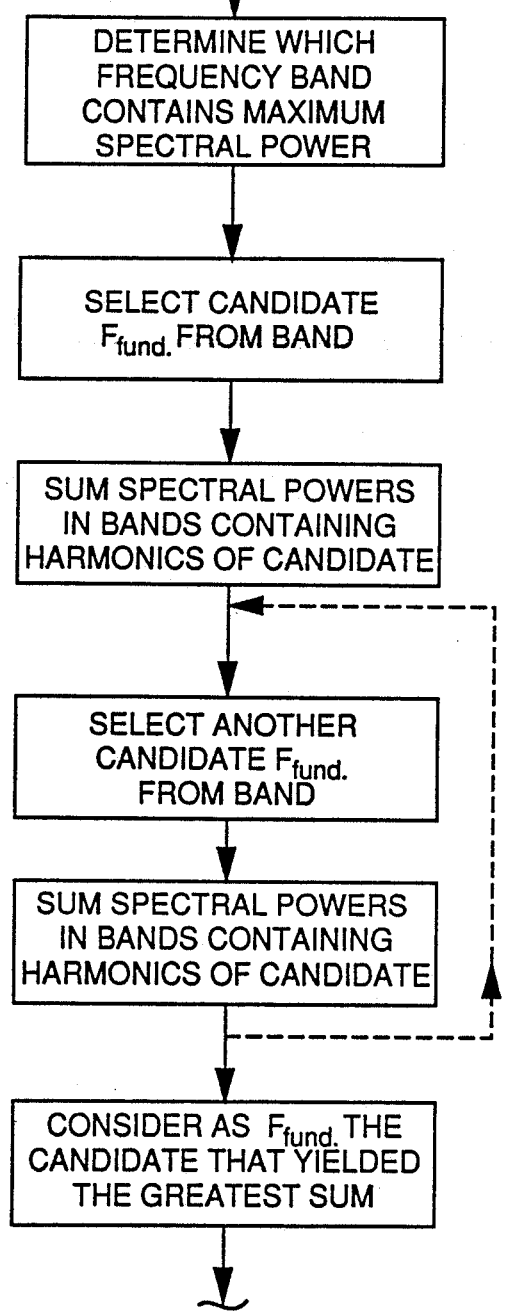
FIG. 3 is a flow chart illustrating one particular technique for approximating the frequency of the fundamental in the process of FIG. 2.

FIG. 3 illustrates in greater detail a fundamental frequency approximation subprocess that may be used in the process of FIG. 2. The subprocess again begins by determining which bin (i.e. which range of frequencies) contains the maximum spectral power. From this range, the process selects a first candidate fundamental frequency. It then computes the quality parameter for this candidate frequency. In this embodiment of the invention, the quality parameter is the sum of the spectral powers of the bins that contain harmonics of the candidate frequency. The process then selects a second candidate frequency from the range and again computes the quality parameter as the sum of the spectral powers of the bins that contain harmonics of this second candidate frequency. Similar steps can be repeated for third, fourth, etc. candidate frequencies. At the conclusion of these trials, the process selects as the best approximation of the fundamental frequency the candidate frequency that yielded the greatest summed harmonics.

FIG. 4 details an approximation subprocess that uses a binary search algorithm to iteratively improve on prior estimates of the fundamental frequency. Again, the subprocess begins by determining which range of frequencies contains the maximum spectral power. This range, termed the first search range, is then divided into lower and upper halves. First and second candidate frequencies are selected from these halves. In particular, the first candidate frequency is selected to be at the middle of the lower half of the frequency range. The second candidate frequency is selected to be at the middle of the upper half of the frequency range. The process then sums the spectral powers in the bins that are computed to contain the second through Nth harmonics of the first candidate frequency and performs a similar summation for the second through Nth harmonics of the second candidate frequency. These sums are then compared. The candidate frequency that yielded the greater sum is the better estimate. The half of the search range from which it was selected is then selected as a new search range and the above steps are repeated.

The foregoing will be made clearer by reference to an example. In the situation discussed in the Background section, the fundamental had an actual frequency of 2700 hertz and was located in a bin that spanned from 2688 to 2944 hertz. In the subprocess of FIG. 4, this range is divided in half and candidate frequencies are selected from the middles of these ranges. The first candidate frequency is thus 2752 hertz and the second candidate frequency is 2880 hertz. Since the true fundamental frequency is at 2700 hertz, it will be recognized that the summed harmonics of the 2752 hertz candidate will be larger than the summed harmonics for the 2880 hertz candidate. Since the 2752 candidate was selected from the lower half of the bin, this lower half is selected as the new search range.

The lower half of the bin spans from 2688 to 2816 hertz. Dividing this new search range in half and selecting new candidate frequencies from the midpoints of the upper and lower halves yields new first and second candidate frequencies of 2720 and 2784 hertz. Again, since the fundamental is at 2700 hertz, the summed harmonics of the 2720 candidate will be greater than the summed harmonics from the 2784 candidate and the lower half of the search range will be selected as the next search range.

The next search range thus extends from 2688 to 2752 hertz. The first and second candidate frequencies are thus 2704 and 2736 hertz. 2704 yields the greater sum, dictating that 2688 to 2720 should be the following search range.

This process continues iteratively, each time narrowing down on the true fundamental frequency. However, after a certain number of iterations, no further improvements can be made on the estimate. This limitation is due to the fact that only a finite number of harmonic bins are examined and each bin has a finite width. In the above example, if the analysis includes the first ten harmonics, then the spectrum up to about 27,000 hertz is examined. However, the 106th bin in which this tenth harmonic is found extends from 26,752 hertz to 27,008 hertz. Thus, fundamental signals anywhere in the range of 2675.2 hertz to 2700.8 hertz will have their tenth harmonics in this bin and cannot be distinguished based on an examination of this bin (nor the lower harmonic number bins). Once both the first and second candidate frequencies have been limited to within this range, all further analyses will find that the sum of harmonics for both candidate signals yields identical results (since the exact same bins are summed), preventing further refinement of the estimate. Put another way, if the process determines that the highest observed harmonic, call it the Nth harmonic, of a signal falls between X and Y hertz, the best it can conclude about the fundamental is that it falls between (X/N) and (Y/N) hertz. Once it has resolved the frequency to within this range, nothing is gained by proceeding further. The remaining ambiguity cannot be resolved without examining still higher harmonics (thereby increasing the denominators of these limiting fractions), or by redesigning the entire process to narrow the bandwidth of each bin (i.e. reducing the difference between X and Y).

In the subprocess of FIG. 4, the iterative refinement of the fundamental frequency estimate terminates when the bandwidth of the newest search range is less than the bin width divided by the number of the highest order harmonic examined. In the above example, the refinement process terminates when the search range becomes narrower than 256/10, or 25.6 hertz. This occurs after L iterations have been performed, where L=1+INT(log$_2$(highest harmonic number))—4 iterations in this example.

From the foregoing, it will be recognized that the methodology of the present invention permits the fundamental frequency to be resolved to an accuracy N times finer than prior art THD techniques, thereby providing a marked improvement in the accuracy of the resulting THD measurement. The resulting measurement represents an upper bound on THD, a figure more relevant than the lower bound yielded by the prior art automated technique. The binary search technique used in the illustrated embodiment quickly determines the fundamental frequency within the resolution constraints imposed by the number of harmonics examined, even if that number is quite large. The process generally ignores non-harmonic noise and can be implemented successfully regardless of whether there are many harmonics or only one in the signal spectrum. The step of summing the spectral power in bins that are determined to contain harmonics is a standard function in many signal analyzers, thereby simplifying implementation of the invention.

Most importantly, the present invention provides a highly accurate method of determining total harmonic distortion without reliance on a skilled operator. It is thus well suited for use in automated test and measurement applications in which accurate automated measurements have been heretofore unavailable.

Having described and illustrated the principles of our invention with reference to a preferred methodology, it should be apparent that the invention can be modified in arrangement and detail without departing from such principles. For example, while the method has been described as relying on the sum of the spectral power in the harmonic bins as the "quality parameter" used in judging the quality of the fundamental frequency estimate, other quality parameters can alternatively be used. Exemplary is a weighted sum of the harmonics. Such a quality parameter is useful, for example, when there is a priori knowledge about the signal, such as that its spectrum does not contain even harmonics. In such case, the weighting coefficients can be selected so that the bins at the even harmonics are not included in the harmonic sum. Similarly, while the invention has been described as using a binary search routine to refine the fundamental frequency estimate, a variety of other techniques can alternatively be used. One is to use overlapping search ranges. Another is to divide the search ranges into thirds instead of halves. In view of these and the wide variety of other methods to which the principles of our invention can be applied, it should be recognized that the disclosed methodology is to be considered illustrative only and not as limiting the scope of our invention. Instead, we claim as our invention all such variations as may come within the scope and spirit of the following claims, and equivalents thereto.

We claim:

1. A method of determining the total harmonic distortion of a signal, comprising the steps:
   decomposing the signal into a plurality of discrete frequency bands;
   approximating the fundamental frequency of the signal; and
   summing the relative spectral powers of the signal in frequency bands that contain harmonics of the approximated fundamental frequency;
   wherein the fundamental frequency is approximated by:
   determining which frequency band contains the maximum spectral power;
   selecting a candidate frequency within said frequency band;
   summing the relative spectral powers in frequency bands that contain harmonics of the candidate frequency; and
   repeating the foregoing two steps, at least once, with different candidate frequencies and consider as the fundamental frequency the candidate frequency that yields the greatest sum.

2. The method of claim 1 which includes the steps:
   quantifying the relative spectral power in the N−1 frequency bands that contain the second through Nth harmonics of the fundamental frequency and computing a weighted sum thereof wherein the weighting coefficients are non uniform.

3. The method of claim 1 in which approximating the fundamental frequency includes the steps:
   (a) determining which frequency band contains the maximum spectral power and considering that band as a first search range;
   (b) selecting a first candidate frequency in a bottom portion of said search range;
   (c) selecting a second candidate frequency in the remaining, upper portion of said search range;
   (d) summing the relative spectral powers in frequency bands that contain harmonics of the first candidate frequency;
   (e) summing the relative spectral powers in frequency bands that contain harmonics of the second candidate frequency;
   (f) comparing said sums to determine which is the greater, and thereby to determine which candidate frequency is the better estimate of the fundamental frequency;
   (g) considering as a second search range the portion of the first search range from which the better candidate frequency was selected; and
   (h) repeating steps (b) through (g), at least once, using said second search range as the first search range.

4. The method of claim 3 in which the bottom and upper portions of the search range are the lower and upper halves thereof, respectively.

5. The method of claim 4 in which the summing steps include summing the relative spectral power in the N−1 frequency bands that contain the second through Nth harmonics of the fundamental frequency.

6. The method of claim 5 which further includes: decomposing the signal into a plurality of discrete frequency bands each having a bandwidth of M hertz; and
repeating steps (b) through (g) using the second search range as the first search range at least until the bandwidth of the first search range is less than M divided by N.

7. The method of claim 1 in which the decomposing step comprises:
   sampling the signal; and
   performing a discrete Fourier transform on the sampled signal.

8. A method of determining the total harmonic distortion of a signal, comprising the steps:
   decomposing the signal into a plurality of discrete frequency bands;
   approximating the fundamental frequency of the signal; and
   summing the relative spectral powers of the signal in frequency bands that contain harmonics of the approximated fundamental frequency;
   wherein the fundamental frequency is approximated by:
   selecting an estimated fundamental frequency;
   computing the value of a parameter that represents the relative quality of the estimate; and
   varying the estimate to maximize the parameter.

9. The method of claim 8 in which the parameter is the sum of the relative spectral powers in frequency bands that contain harmonics of the estimated frequency.

10. The method of claim 8 in which the parameter is a weighted sum of the relative spectral powers in frequency bands that contain harmonics of the estimated frequency, wherein the weighting coefficients are non uniform.

* * * * *